(12) United States Patent
Onodera

(10) Patent No.: US 8,637,997 B2
(45) Date of Patent: Jan. 28, 2014

(54) SEMICONDUCTOR DEVICE AND METHOD OF MANUFACTURING THE SAME

(75) Inventor: Masanori Onodera, Tokyo (JP)

(73) Assignee: Spansion LLC, Sunnyvale, CA (US)

( * ) Notice: Subject to any disclaimer, the term of this patent is extended or adjusted under 35 U.S.C. 154(b) by 179 days.

(21) Appl. No.: 11/986,370

(22) Filed: Nov. 20, 2007

(65) Prior Publication Data

US 2008/0157331 A1 Jul. 3, 2008

Related U.S. Application Data

(63) Continuation-in-part of application No. PCT/JP2006/353411, filed on Dec. 27, 2006.

(30) Foreign Application Priority Data

Dec. 27, 2006 (JP) ................................ 2006-353411

(51) Int. Cl.
*H01L 23/52* (2006.01)
*H01L 21/48* (2006.01)

(52) U.S. Cl.
USPC ........... 257/777; 257/666; 257/686; 257/724; 257/E21.502; 257/E23.004; 257/E23.069; 438/109; 438/125; 438/618

(58) Field of Classification Search
USPC .......... 257/684–686, 723, 777, 778, E23.085, 257/666, 724, E21.502, E23.004, E23.069; 438/109, 125, 618
See application file for complete search history.

(56) References Cited

U.S. PATENT DOCUMENTS

| | | | | |
|---|---|---|---|---|
| 5,903,049 A | * | 5/1999 | Mori | 257/686 |
| 6,353,263 B1 | * | 3/2002 | Dotta et al. | 257/777 |
| 6,476,502 B2 | * | 11/2002 | Yamada et al. | 257/778 |
| 6,731,010 B2 | * | 5/2004 | Horiuchi et al. | 257/777 |
| 6,794,273 B2 | * | 9/2004 | Saito et al. | 438/462 |
| 6,992,396 B2 | * | 1/2006 | Arai et al. | 257/777 |
| 7,176,506 B2 | * | 2/2007 | Beroz et al. | 257/232 |
| 7,298,045 B2 | * | 11/2007 | Fujitani et al. | 257/724 |
| 7,768,125 B2 | * | 8/2010 | Chow et al. | 257/738 |
| 7,928,558 B2 | * | 4/2011 | Brunner et al. | 257/700 |
| 2002/0031867 A1 | * | 3/2002 | Horiuchi et al. | 438/125 |
| 2007/0138605 A1 | * | 6/2007 | Nam et al. | 257/666 |
| 2008/0042251 A1 | * | 2/2008 | Weng et al. | 257/686 |

FOREIGN PATENT DOCUMENTS

| WO | WO 2006005317 | * | 1/2006 |
|---|---|---|---|
| WO | WO2006005317 | * | 1/2006 |

* cited by examiner

*Primary Examiner* — Dao H Nguyen

(57) ABSTRACT

The present invention provides a semiconductor device with an improved yield ratio and reduced height and manufacturing cost; and a method of manufacturing the semiconductor device. According to an aspect of the present invention, there is provided a semiconductor device including a substrate, a semiconductor element that is flip-chip connected to the substrate, and a molding portion that seals the semiconductor element. The side surfaces of the semiconductor element are enclosed by the molding portion. An upper surface of the semiconductor element is not enclosed by the molding portion. Damage to the side surfaces of the semiconductor element caused by an external impact when the semiconductor device is stored is minimized, because the molding portion protects the side surfaces of the semiconductor element. Accordingly, the yield ratio of the semiconductor device is improved. The height of the semiconductor device can also be reduced since the upper surface of the semiconductor element is not enclosed with the molding portion.

14 Claims, 17 Drawing Sheets

SEMICONDUCTOR DEVICE AND METHOD OF MANUFACTURING THE SAME

CLAIM OF PRIORITY

This is a continuation-in-part of International Application No. PCT/JP 2006/353411, filed Dec. 27, 2006 which was not published in English under PCT Article 21(2).

TECHNICAL FIELD

This invention generally relates to a semiconductor device and a method of manufacturing the semiconductor device, and in particular, relates to a semiconductor device in which a plurality of built-in semiconductor devices are stacked and a method of manufacturing the semiconductor device.

BACKGROUND OF THE INVENTION

Recently, there has been a demand for downsizing a semiconductor device that is used for a portable electronic device such as a mobile phone or a nonvolatile record media of an IC memory card. As such, there is a demand for packaging a semiconductor element efficiently. There exists an art in which a semiconductor element is stacked and is packaged.

A description will be given of a first through third conventional embodiments as an example of the art where the semiconductor element is stacked and is packaged. A description will be given of a semiconductor device in accordance with the first conventional embodiment, with reference to FIG. 1. As shown in FIG. 1, the semiconductor device in accordance with the first conventional embodiment has mainly a substrate 10, a semiconductor element 14 and a built-in semiconductor device 48.

The built-in semiconductor device 48 has a substrate 12, a semiconductor element 18, a die attach 22, a wire-connecting pad 34, a wire 32 and a molding portion 24. The semiconductor element 18 is die-bonded to the substrate 12 and the semiconductor element 18 is electrically coupled to the substrate 12 through the wire 32 made of gold (Au). The semiconductor element 18 is enclosed by a molding portion 24. The molding portion 24 is formed with an epoxy resin or the like.

A wire-connecting pad 34 made of Au, Cu (copper) or the like, a pad 40 for flip-chip connecting, an electrode-connecting portion 36 and a land electrode 38 on the substrate 10 made of glass epoxy or the like are each formed. A solder ball 42 as a connecting terminal is coupled to a lower surface of the substrate 10. The semiconductor element 14 made of silicon or the like is mounted on the substrate 10. The semiconductor element 14 is electrically coupled to the substrate 10 with a bump 46 made of Au, Cu or the like. A space between the substrate 10 and the semiconductor element 14 is filled with an under fill 44 made of epoxy resin or the like. The semiconductor element 14 is enclosed by a molding portion 28. The molding portion 28 is formed with an epoxy resin or the like. The built-in semiconductor device 48 is fixed to the molding portion 28 with a fixing agent, forming a fixing portion 20. The built-in semiconductor device 48 is electrically coupled to the substrate 10 with a wire 30 made of Au or the like. The built-in semiconductor device 48 and the molding portion 28 are enclosed by a molding portion 26. The molding portion 26 is formed with an epoxy resin or the like.

A description will be given of a semiconductor device in accordance with the second conventional embodiment with reference to FIG. 2. As shown in FIG. 2, the semiconductor device in accordance with the second conventional embodiment includes: a substrate 10, a semiconductor element 14, a semiconductor element 14a and a built-in semiconductor device 48. In FIG. 2, there is provided a semiconductor element 14a, the height of which is different from that of the semiconductor element 14. Also, the molding portion 28 shown in FIG. 1 is not formed in the case of FIG. 2.

A description will be given of a semiconductor device in accordance with the third conventional embodiment with reference to FIG. 3. As shown in FIG. 3, the semiconductor device in accordance with the third conventional embodiment includes the substrate 10, the semiconductor element 14 and a built-in semiconductor device 52. The semiconductor element 14 is mounted on the substrate 10. The built-in semiconductor device 52 is mounted on the semiconductor element 14. The built-in semiconductor device 52 is electrically coupled to the substrate 10 with a solder ball 68.

The built-in semiconductor device 52 has a substrate 50, a semiconductor element 58, a semiconductor element 60, a die attach 62, a die attach 64, the wire-connecting pad 34, a wire 54, a wire 56, the land electrode 38, the electrode-connecting portion 36 and a molding portion 66. The semiconductor element 58 and the semiconductor element 60 are die-bonded to each other with the die attach 64. The substrate 50 and the semiconductor element 58 are die-bonded to each other with the die attach 62. The substrate 50 and the semiconductor element 58 are electrically coupled to each other with the wire 56 made of Au or the like. The substrate 50 and the semiconductor element 60 are electrically coupled to each other with the wire 54 made of Au or the like. The semiconductor element 58 and the semiconductor element 60 are enclosed by the molding portion 66. The molding portion 66 is formed from an epoxy resin or the like. The same components have the same reference numerals as in FIG. 1 and FIG. 2 in order to avoid a duplicated explanation.

Japanese Patent Application Publication No. 2003-282814 (hereinafter referred to as Document 1) discloses a semiconductor device in which an entire semiconductor element is enclosed by an epoxy resin or the like. The invention shown in Document 1 is characterized in that the entire semiconductor element is enclosed and any damage to the semiconductor element is minimized.

In the semiconductor device in accordance with the first conventional embodiment, the upper surface of the semiconductor element 14 is enclosed by the molding portion 28. The height of the semiconductor device is increased by the thickness of the molding portion 28. Therefore, there is a limit to the reduction of the height of the semiconductor device. When the substrate 10 and the substrate 12 are coupled to each other with the wire 30, it is necessary to keep a temperature of the wire-connecting pad 34 a given value by heating the substrate 10, the wire-connecting pad 34 being connected to the wire 30 of the substrate 12.

Here, generally, a thermal conductivity of the epoxy resin composing the molding portion 28 is lower than that of the silicon composing the semiconductor element 14. It is therefore difficult to conduct the heat from the substrate 10 to the wire-connecting pad 34 of the substrate 12 effectively when the substrate 10 and the substrate 12 are coupled to each other with the wire 30, in a case where the molding portion 28 is on the upper surface of the semiconductor element 14. It is difficult to connect the wire stably, and the yield ratio of the semiconductor device is reduced.

It is not possible to mount the built-in semiconductor device 48 horizontally, in a case where the height of the semiconductor element 14 is different from that of the semiconductor element 14a as is the case of the semiconductor device in accordance with the second conventional embodiment. This results in an inferior semiconductor device. Furthermore, the yield ratio of the semiconductor device gets reduced. It is possible to mount the built-in semiconductor device 48 horizontally by adjusting the thickness of the fixing portion 20, in a case where the height of the semiconductor element 14 is different from that of the semiconductor element 14a. In this case, however, the height of the semiconductor device increases, because the thickness of the fixing portion 20 gets larger by necessity.

Further, in the semiconductor device in accordance with the third conventional embodiment, the side surface of the semiconductor element 14 is exposed. Therefore, the risk of damaging the side surface of the semiconductor element 14 caused by an external impact increases in the previous mounting of the built-in semiconductor device 52. As a result, the yield ratio of the semiconductor device is reduced. In the semiconductor device disclosed in Document 1, it is possible to reduce the risk of damage to the side surface of the semiconductor element 14 caused by an external impact, because the molding portion protects the side surface of the semiconductor element. However, there is the same problem as the case of the first conventional embodiment in the semiconductor device disclosed in Document 1, because the upper surface of the semiconductor element is enclosed by the molding portion.

SUMMARY OF THE INVENTION

The present invention provides a semiconductor device with an improved yield ratio and reduced height and manufacturing cost; and a method of manufacturing the semiconductor device.

According to an aspect of the present invention, there is provided a semiconductor device including a substrate, a semiconductor element that is flip-chip connected to the substrate, and a molding portion that seals the semiconductor element. An entire side surface of the semiconductor element is enclosed by the molding portion. An upper surface of the semiconductor element is not enclosed by the molding portion. With this structure, it is possible to minimize of the damage to the side surface of the semiconductor element caused by an external impact when the semiconductor device is stored, because the molding portion protects the entire side surface of the semiconductor element. Accordingly, it is possible to improve the yield ratio of the semiconductor device. It is also possible to reduce the height of the semiconductor device since the upper surface of the semiconductor element is not enclosed with the molding portion. The semiconductor device may have a plurality of the semiconductor elements. The heights of each of the semiconductor elements may be substantially equal to each other. With this structure, mounting a built-in semiconductor device horizontally on the semiconductor element is simple.

A built-in semiconductor device may be mounted on the semiconductor element. With this structure, it is possible to minimize of the damage to the side surface of the semiconductor element caused by an external impact at any time before mounting the built-in semiconductor device or during the mounting of the built-in semiconductor device, because the side surface of the semiconductor element is covered with the molding portion.

The semiconductor device may include a fixing portion on the semiconductor element. The built-in semiconductor device may be directly fixed to the semiconductor element through the fixing portion. With this structure, it is possible to reduce the height of the semiconductor device.

An entire upper surface of the semiconductor element may be covered with the fixing portion. With this structure, it is possible to minimize the peeling of the molding portion from the side surface of the semiconductor element, because the fixing portion protects the interface between the side surface of the semiconductor element and the molding portion. It is also possible to improve the yield ratio of the semiconductor device.

A projection area at the upper surface of the semiconductor device where the built-in semiconductor device is projected may be inside of the upper surface of the semiconductor element. With this structure, it is possible to conduct the heat from the substrate to the built-in semiconductor device at a maximum level, because the heat from the substrate is conducted to the built-in semiconductor device via the semiconductor element and the fixing portion when the built-in semiconductor device is coupled to the substrate. It is therefore possible to connect the built-in semiconductor device to the substrate stably. It is therefore possible to improve the yield ratio of the semiconductor device.

The built-in semiconductor device may be mounted on the semiconductor element so that a space is formed between the built-in semiconductor device and the semiconductor element. With this structure, it is possible to mount the built-in semiconductor device on the semiconductor device in which the entire side surface is covered with the molding portion and the upper surface is not covered with the molding portion. It is possible to minimize the damage to the side surface of the semiconductor element caused by an external impact, at any time before mounting the built-in semiconductor device or when mounting the built-in semiconductor device. It is therefore possible to improve the yield ratio of the semiconductor device. It is also possible to reduce the thickness of the semiconductor device because the upper surface of the semiconductor element is not covered with the molding portion.

According to another aspect of the present invention, there is provided a method of manufacturing a semiconductor device including flip-chip connecting a semiconductor element to a substrate, forming a molding portion that seals an entire semiconductor element, and fabricating the molding portion so that the upper surface of the semiconductor element is exposed. With this method, it is possible to manufacture the semiconductor device in which the entire side surface is covered with the molding portion and an upper surface is not covered with the molding portion. Fabricating the molding portion may include grinding the molding portion. Fabricating the molding portion may also include adjusting the heights of each of the upper faces of the semiconductor elements to be substantially equal to each other. With this method, it is possible to control the height of each of the semiconductor elements to be substantially equal to each other with one fabricating process. It is therefore easy to mount the built-in semiconductor device horizontally. Fabricating the molding portion may include reducing the thickness of the semiconductor element. With this method, it is possible to reduce the thickness of the semiconductor device to a desirable amount.

The method may further include mounting a built-in semiconductor device on the semiconductor element. With this method, it is possible to mount the built-in semiconductor device on the semiconductor device in which the entire side surface is covered with the molding portion and an upper surface is not covered with the molding portion.

Mounting the built-in semiconductor device on the semiconductor element may include fixing the built-in semiconductor device directly on the semiconductor element. Fixing the built-in semiconductor device directly on the semiconductor element may include coating a fixing agent so that the fixing agent covers the upper surface of the semiconductor element. With this method, the fixing portion protects an interface between the side surface of the semiconductor device and the molding portion. It is therefore possible to minimize the peeling at an interface between the molding portion and the semiconductor element. Mounting the built-in semiconductor device may include mounting the built-in semiconductor device so that a space is formed between the semiconductor element and the built-in semiconductor device. With this method, it is possible to mount the built-in semiconductor device on the semiconductor device in which the entire side surface is covered with the molding portion and an upper surface is not covered with the molding portion. It is possible to minimize the damage to the side surface of the semiconductor element caused by an external impact, at any time before mounting the built-in semiconductor device or during the mounting of the built-in semiconductor device, because the entire side surface of the semiconductor element is covered with the molding portion. It is also possible to improve the yield ratio of the semiconductor device. Mounting the built-in semiconductor device on the semiconductor element may include coupling the semiconductor element to the built-in semiconductor device electrically with a bump. With this method, it is possible to connect the semiconductor element to the built-in semiconductor device with a small bump, because there is no molding portion on the semiconductor element. It is therefore possible to reduce the thickness of the semiconductor device. It is also possible to reduce an interval between the bumps in a lateral direction. As such, it is possible to reduce the size of the semiconductor device.

DETAILED DESCRIPTION

Figure 1:
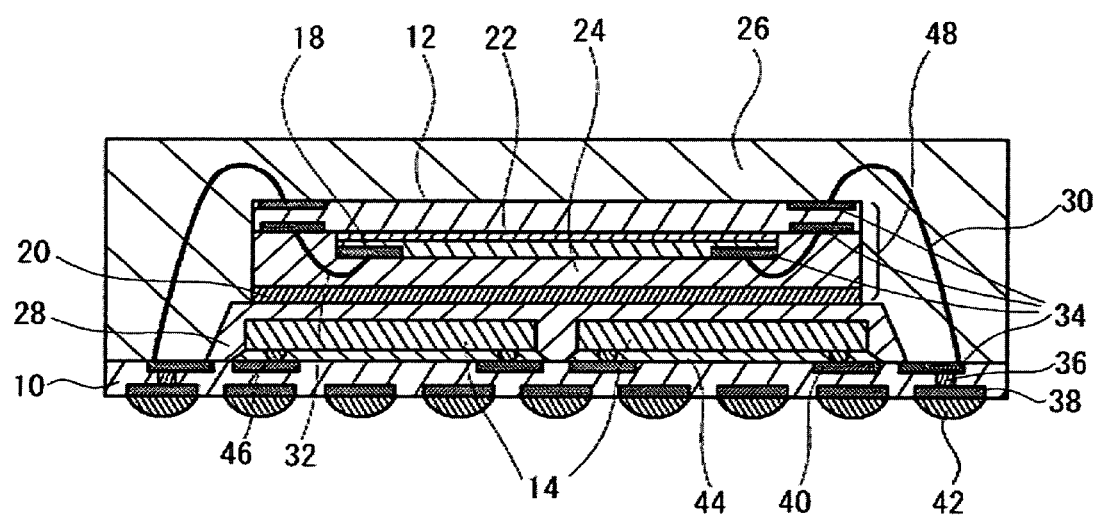
FIG. 1 illustrates a cross sectional view of a semiconductor device in accordance with a first conventional embodiment.

Reference will now be made in detail to various embodiments in accordance with the invention, examples of which are illustrated in the accompanying drawings. While the invention will be described in conjunction with various embodiments, it will be understood that these various embodiments are not intended to limit the invention to these embodiments. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details. In other instances, well known methods, procedures, components, and circuits have not been described in detail as not to unnecessarily obscure aspects of the invention.

A semiconductor device in accordance with a first embodiment has a substrate, a semiconductor element that is flip-chip connected to the substrate, and a molding portion that seals the semiconductor element. The entire side surface of the semiconductor element is enclosed. An upper surface of the semiconductor element (a surface on an opposite side of the substrate 10) is not enclosed. A description will be given of the first embodiment with reference to FIG. 4. There is provided a land electrode 38 made of Au or Cu, a electrode-connecting portion 36, and a pad 40 for flip-chip connecting on the substrate 10 made of glass epoxy or the like. Two of the semiconductor elements 14 made of silicon or the like are flip-chip connected on the substrate 10 with a bump 46 made of Au or Cu. The semiconductor element 14 has a height of approximately 150 μm. A space between the semiconductor element 14 and the substrate 10 is filled with an epoxy resin or the like to form the under fill 44. An entire side surface of the semiconductor element 14 is enclosed by the molding portion 28. The molding portion 28 is formed with a resin or the like. The solder ball 42 is connected to the lower surface of the substrate 10 and acts as a lower connection terminal. The solder ball 42 may be made of lead-tin solder (Pb—Sn), lead-free solder (SnAgCu or the like), tin-zinc solder (SnZn) or the like. The solder ball 42 has a height of approximately 300 μm.

In the first embodiment, the entire side surface of the semiconductor element 14 is enclosed by the molding portion 28. It is therefore possible to minimize of the damage to the side surface of the semiconductor device caused by an external impact, when the semiconductor device is stored in a tray or the like. Accordingly, it is possible to improve the yield ratio of the semiconductor device. The upper surface of the semiconductor element 14 is not enclosed by the molding portion 28. It is therefore possible to reduce the height of the semiconductor device. In the first embodiment, two of the semiconductor elements 14 are mounted. It is possible to obtain the same advantage even if the number of the semiconductor element 14 is one or more than three. It is preferable that the heights of each of the semiconductor elements 14 is substantially equal to each other so that the built-in semiconductor device may be mounted horizontally on the semiconductor element 14. With this structure, it is possible to improve the yield ratio of the semiconductor device because the built-in semiconductor device may be mounted horizontally, as mentioned later.

In a second embodiment, a description will be given of a method of manufacturing a semiconductor device shown in FIG. 4. The second embodiment is shown in FIG. 5A through FIG. 5C. As shown in FIG. 5A through FIG. 5C, the method in accordance with the second embodiment includes: flip-chip connecting, molding, and fabricating a molding portion. FIG. 5A illustrates flip-chip connecting the semiconductor element 14 to the substrate 10. As shown in FIG. 5A, there is provided a pad 40 for flip-chip connecting, a land electrode 38, a wire-connecting pad 34 and an electrode connecting portion 36 on the substrate 10 in advance. The semiconductor element 14 is flip-chip connected to the upper surface of the substrate 10 with the solder bump 46. A space between the substrate 10 and the semiconductor element 14 is filled with an epoxy resin or the like to form the under fill 44 in order to minimize the intrusion of dust or water.

FIG. 5B illustrates the process of enclosing the semiconductor element 14. As shown in FIG. 5B, the side surfaces of the semiconductor element 14 are covered with the molding portion 28. The molding portion 28 is formed from an epoxy resin or the like. FIG. 5C illustrates the process of fabricating the molding portion 28. As shown in FIG. 5C, the molding portion 28 is ground so that the upper surface of the semiconductor element 14 is exposed. In a case where the number of the semiconductor element 14 is more than two and the heights of each of the semiconductor elements 14 is different from each other, each of the semiconductor elements 14 is ground so that the heights of each of the semiconductor elements 14 is substantially equal to each other. Further, the semiconductor element 14 is ground to a desired thickness.

With the manufacturing method in accordance with the second embodiment, it is possible to manufacture the semiconductor device in which the entire side surface of the semiconductor element 14 is enclosed by the molding portion 28 and the upper surface of the semiconductor element 14 is not enclosed by the molding portion 28. It is also possible to control the height of each of the semiconductor elements 14 to be substantially equal to each other with one fabricating process, even if the number of the semiconductor element 14 is more than two and the height of each of the semiconductor elements 14 is different from each other. Accordingly, it is possible to mount the built-in semiconductor device horizontally on the semiconductor element 14. It is also possible to reduce the height of the semiconductor device because it is possible to reduce the thickness of the semiconductor element 14 to a desired amount with the fabricating process. For example, it is possible to reduce the thickness of the semiconductor element 14 to approximately 100 to 150 μm. The molding portion 28 is ground in the second embodiment, but the molding portion 28 may also be polished. The polishing process has an advantage in that any damage to the semiconductor element 14 is less significant, compared to the grinding process. However, the grinding process is preferable to the polishing process from a manufacturing cost view point, because the fabricating rate of the polishing process is less than that of the grinding process.

Figure 2:
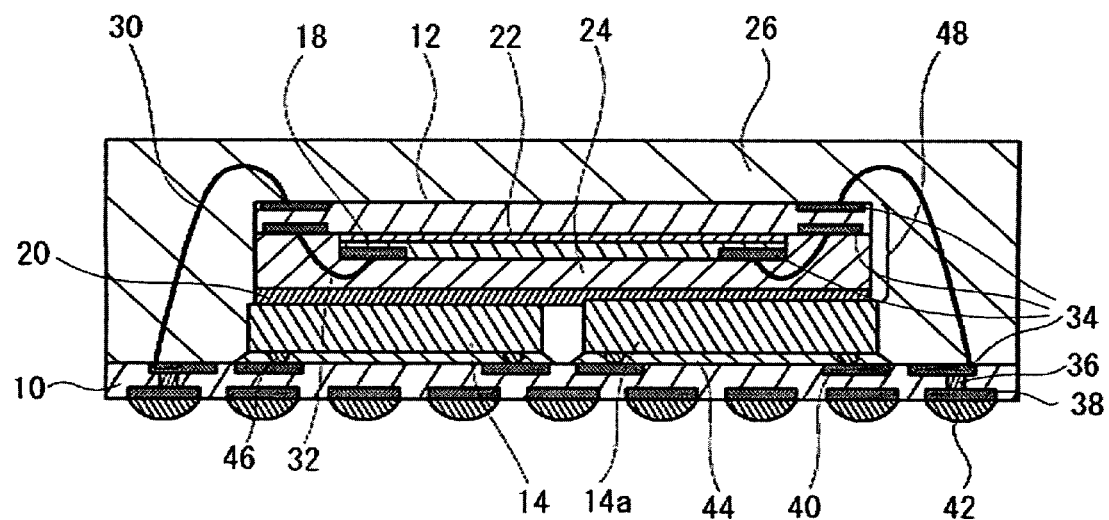
FIG. 2 illustrates a cross sectional view of a semiconductor device in accordance with a second conventional embodiment.
Figure 4:
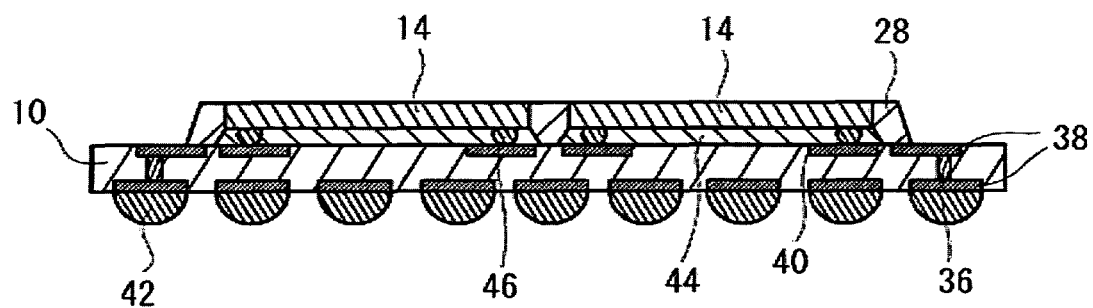
FIG. 4 illustrates a cross sectional view of a semiconductor device in accordance with a first embodiment of the present invention.
Figure 5A:
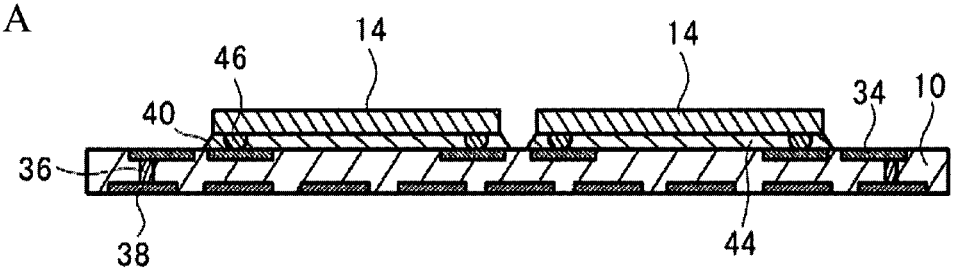
FIG. 5A through FIG. 5C illustrate a cross sectional view showing a manufacturing method of a semiconductor device in accordance with a second embodiment.
Figure 5B:
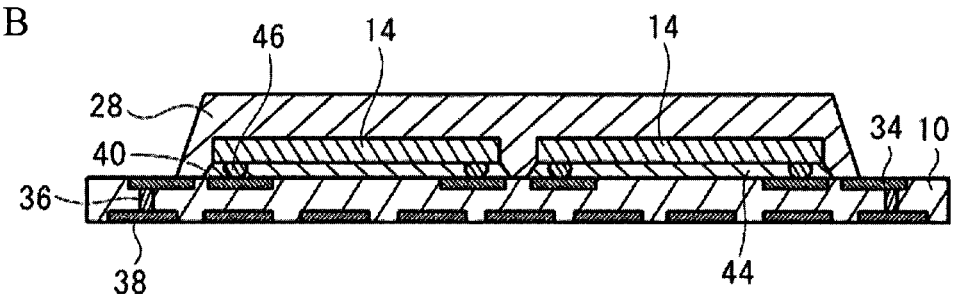
Figure 5C:
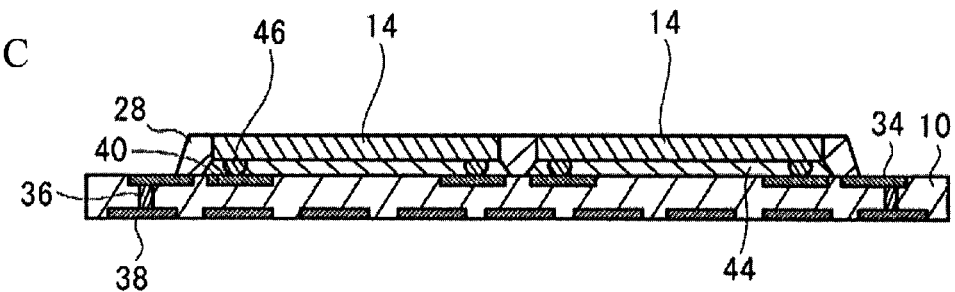
Figure 6:
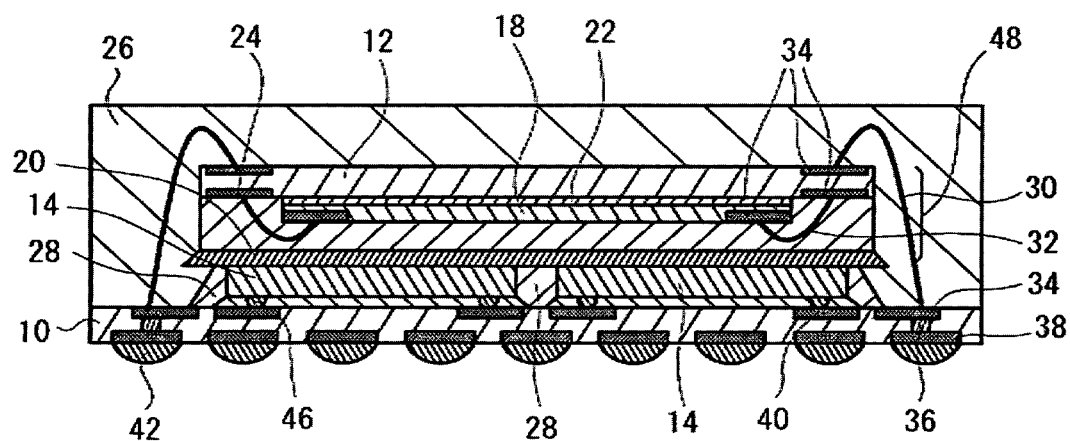
FIG. 6 illustrates a cross sectional view of a semiconductor device in accordance with a third embodiment.

In a semiconductor device in accordance with a third embodiment, the built-in semiconductor device 48 is mounted on the semiconductor device in accordance with the first embodiment shown in FIG. 4. A description will be given of the third embodiment, with reference to FIG. 6. In FIG. 6, a molding portion 28 is provided and a semiconductor element 14 is provided instead of the semiconductor element 14a, as in FIG. 2 illustrating the second conventional embodiment. The built-in semiconductor device 48 may be a chip, a semiconductor element or the like if the built-in semiconductor device 48 is able to be mounted on the semiconductor element 14. The built-in semiconductor device 48 may be surface-up mounted or may be surface-down mounted.

In FIG. 6, the side surface of the semiconductor element 14 is covered with the molding portion 28. It is therefore possible to minimize the damage to the side surface of the semiconductor element 14 caused by an external impact at any time before mounting the built-in semiconductor device 48 or when mounting the built-in semiconductor device 48. Also, the built-in semiconductor device 48 is directly fixed to the upper surface of the semiconductor element 14 through the fixing portion 20. It is therefore possible to reduce the height of the semiconductor device.

Figure 7:
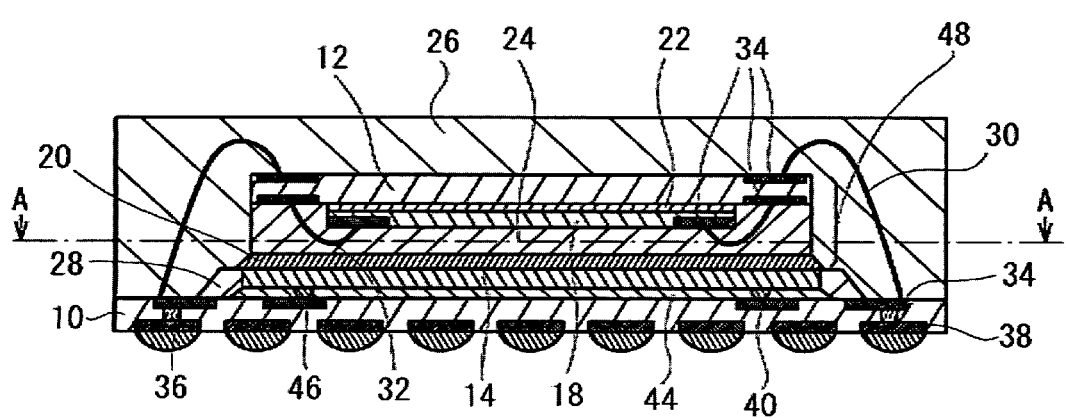
FIG. 7 illustrates a cross sectional view of a semiconductor device in accordance with a fourth embodiment.
Figure 8:
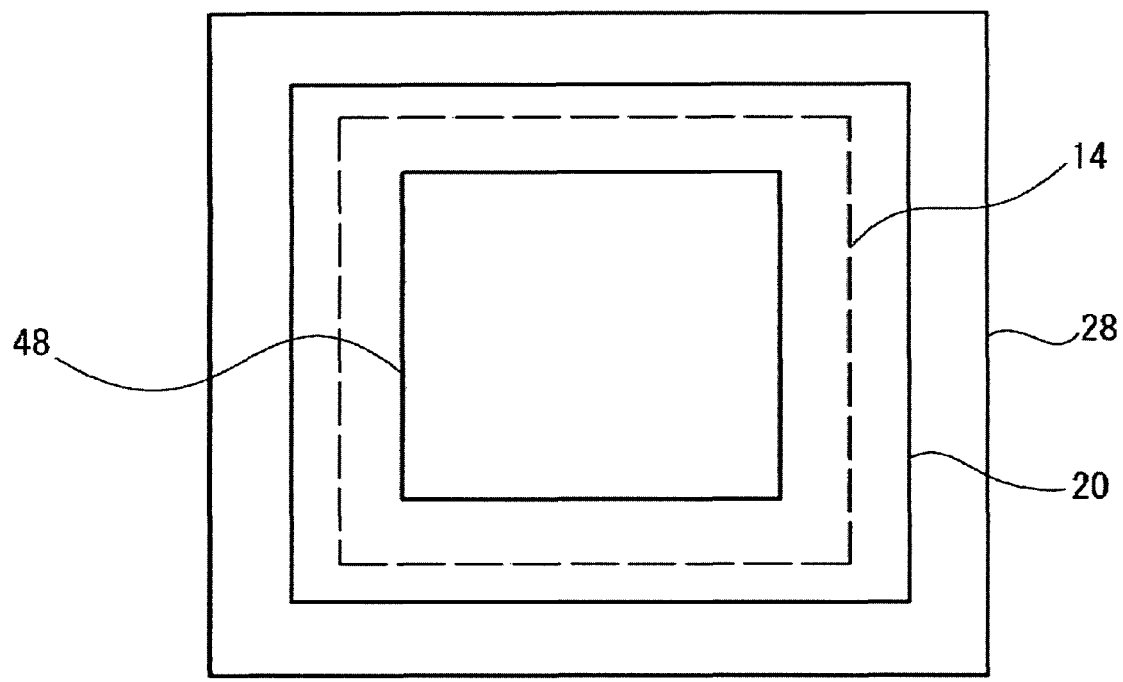
FIG. 8 illustrates a schematic view of a cross section A-A shown in FIG. 7 viewed from upside.

In a fourth embodiment, the number of the semiconductor elements 14 is one. FIG. 7 illustrates a cross sectional view of a semiconductor device in accordance with the fourth embodiment. FIG. 8 illustrates a schematic view of a cross section A-A viewed from above and a positional relationship between the built-in semiconductor device 48, the fixing portion 20, the semiconductor element 14 and the molding portion 28. In FIG. 8, the molding portion 26 shown in FIG. 7 is not shown.

As shown in FIG. 7 and FIG. 8, in a semiconductor device in accordance with the fourth embodiment, the entire upper surface of the semiconductor element 14 is covered with the fixing portion 20. It is therefore possible to minimize the peeling of the molding portion 28 from the side surface of the semiconductor element 14 because the fixing portion 20 protects the interface between the side surface of the semiconductor element 14 and the molding portion 28. It is also possible to improve the yield ratio of the semiconductor device.

As shown in FIG. 8, a region of the upper surface of the semiconductor element 14 where the built-in semiconductor device 48 is projected is inside of the upper surface of the semiconductor element 14. In other words, the built-in semiconductor device 48 is not in contact with the molding portion 28, and is directly fixed only to the upper surface of the semiconductor element 14 through the fixing portion 20. With this structure, it is possible to mount the built-in semiconductor device 48 mentioned later and to improve thermal conductivity from the substrate 10 to the substrate 12 when connecting the wire. It is therefore possible to improve the yield ratio of the semiconductor device because the built-in semiconductor device 48 may be stably connected to the wire.

Figure 9A:
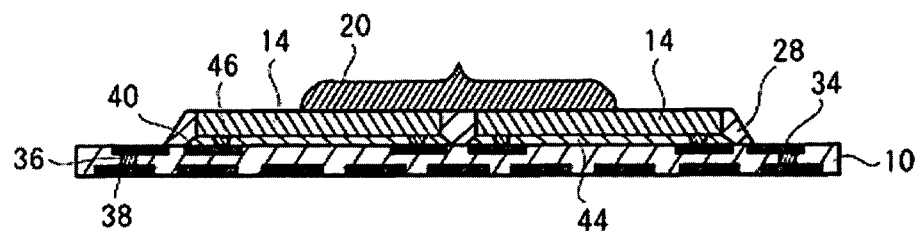
FIG. 9A through FIG. 9C illustrate a cross sectional view showing a manufacturing method of a semiconductor device in accordance with a fifth embodiment.
Figure 9B:
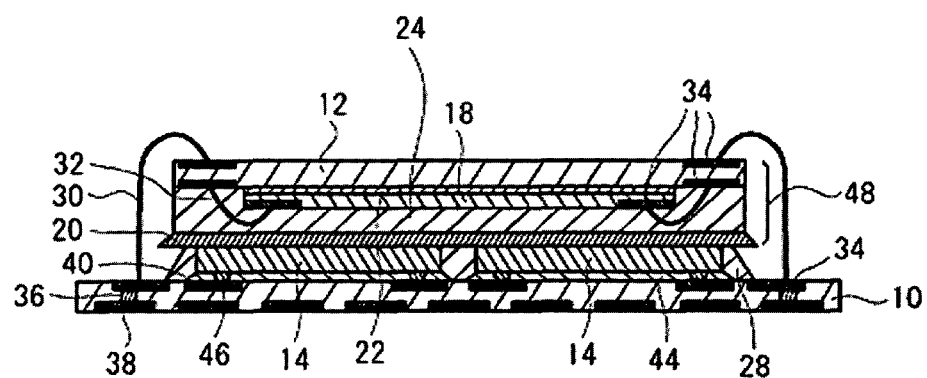
Figure 9C:
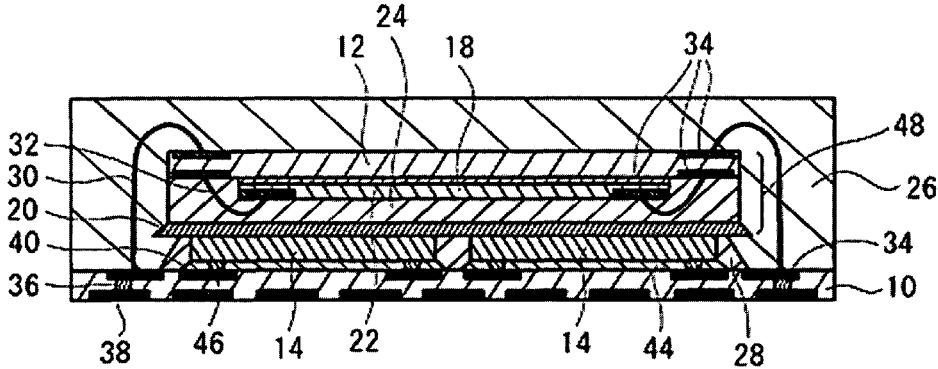

In a fifth embodiment, a description will be given of a method of manufacturing a semiconductor device in accordance with the third embodiment shown in FIG. 6. FIG. 9A through FIG. 9C illustrate the fifth embodiment. As shown in FIG. 9A through FIG. 9C, the method in accordance with the fifth embodiment includes: coating an adhesive agent, mounting the built-in semiconductor device, and enclosing the built-in semiconductor device. FIG. 9A illustrates a process of coating the adhesive agent. As shown in FIG. 9A, the semiconductor device manufactured with the process shown in FIG. 5C is provided. The adhesive agent is coated on the semiconductor element 14 and the fixing portion 20 is formed. FIG. 9B illustrates a process of mounting the built-in semiconductor device 48. As shown in FIG. 9B, the built-in semiconductor device 48 is pressed on the fixing portion 20 directly. The built-in semiconductor device 48 is fixed to the upper surface of the semiconductor element 14. The wire 30 made of Au is connected to the substrate 10 and the substrate 12. The built-in semiconductor device 48 is electrically coupled to the substrate 10. FIG. 9C illustrates a process of enclosing the built-in semiconductor device 48 with an epoxy resin or the like. As shown in FIG. 9C, the built-in semiconductor device 48 is enclosed by the molding portion 26. The molding portion 26 is formed with an epoxy resin.

With the manufacturing process shown in FIG. 9A through FIG. 9C, it is possible to manufacture the semiconductor device shown in FIG. 6. In the manufacturing process shown in FIG. 9B, the built-in semiconductor device 48 is pressed to the adhesive agent, and the adhesive agent is flattened. The adhesive agent is coated so as to cover the upper surface of the semiconductor element 14. Accordingly, the fixing portion 20 protects the interface between the side surface of the semiconductor element 14 and the molding portion 28. It is therefore possible to minimize the peeling of the molding portion 28 from the semiconductor element 14.

Further, in the process shown in FIG. 9C, the molding portion 28 does not enclose the upper surface of the semiconductor element 14. That is, the built-in semiconductor device 48 is not in contact with the molding portion 28, and is directly fixed only to the upper surface of the semiconductor element 14. Generally, the thermal conductivity of the epoxy resin composing the molding portion 28 is lower than that of silicon composing the semiconductor element 14. It is therefore possible to conduct the heat from the substrate 10 to the built-in semiconductor device 48 at a maximum level, because the heat from the substrate 10 is conducted to the built-in semiconductor device 48 via the semiconductor element 14 and the fixing portion 20 when the substrate 10 is coupled to the substrate 12 with the wire 30. It is therefore possible to stably couple the built-in semiconductor device 48 to the substrate 10 with the wire. As such, it is possible to improve the yield ratio of the semiconductor device. In the fifth embodiment, the adhesive agent is used as the fixing agent. The built-in semiconductor device 48 may be fixed with a metal or the like in addition to the adhesive agent.

Figure 3:
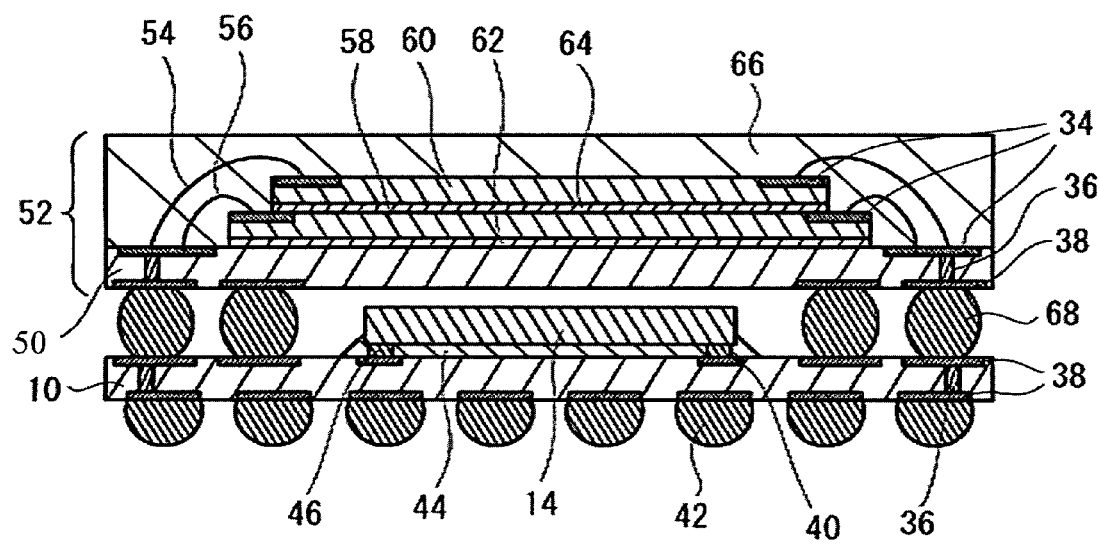
FIG. 3 illustrates a cross sectional view of a semiconductor device in accordance with a third conventional embodiment.
Figure 10:
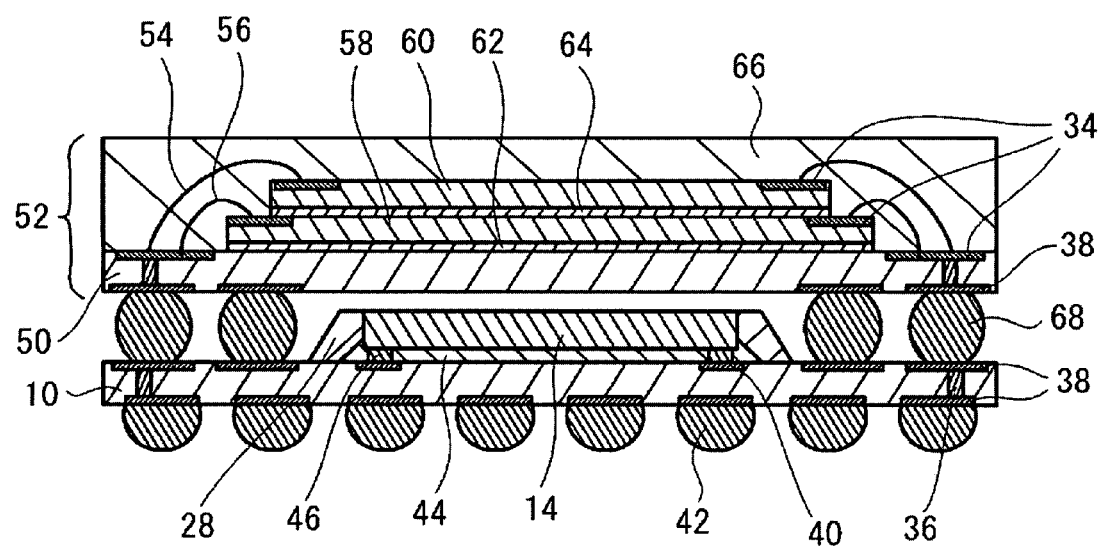
FIG. 10 illustrates a cross sectional view of a semiconductor device in accordance with a sixth embodiment.

In a sixth embodiment, the built-in semiconductor device is package-on-package mounted on the semiconductor device in accordance with the first embodiment shown in FIG. 4. FIG. 10 illustrates the sixth embodiment. As shown in FIG. 10, in the semiconductor device shown in FIG. 10, the number of semiconductor elements 14 is one and the built-in semiconductor device 52 is mounted on the semiconductor element 14 through the solder ball 68 so that a space is formed between the built-in semiconductor device 52 and the semiconductor element 14, to be distinguished from the first embodiment shown in FIG. 4. In the semiconductor device in accordance with the sixth embodiment, the entire side surface of the semiconductor element 14 is enclosed by the molding portion 28, to be distinguished from the third conventional embodiment shown in FIG. 3. The built-in semiconductor device 52 may be a chip, a semiconductor element or the like if the built-in semiconductor device 52 is capable of being package-on-package mounted on the semiconductor element 14. Also, the built-in semiconductor device 52 may be surface-up mounted or may be surface-down mounted.

In the semiconductor device shown in FIG. 10, the entire side surface of the semiconductor element 14 is enclosed by the molding portion 28, as distinguished from the semiconductor device in accordance with the third conventional embodiment. It is therefore possible to minimize the damage to the side surface of the semiconductor element 14 caused by an external impact, at any time before mounting the built-in semiconductor device 52 or when mounting the built-in semiconductor device 52. It is also possible to improve the yield ratio of the semiconductor device. A distance between the substrate 10 and the substrate 50 may be reduced because the molding portion 28 is not formed on the upper surface of the semiconductor element 14. It is therefore possible to reduce the height of the semiconductor device.

Figure 11A:
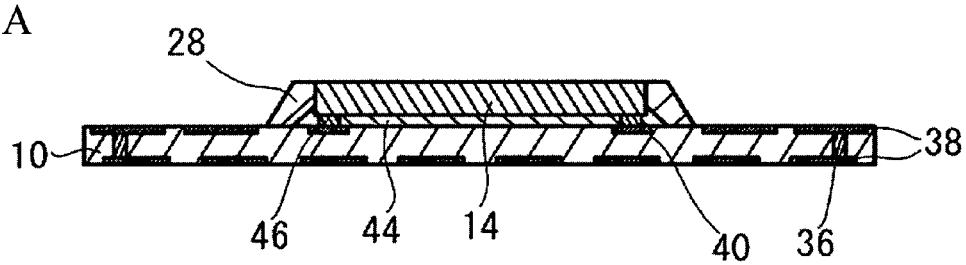
FIG. 11A and FIG. 11B illustrate a cross sectional view showing a manufacturing method of a semiconductor device in accordance with a seventh embodiment.
Figure 11B:
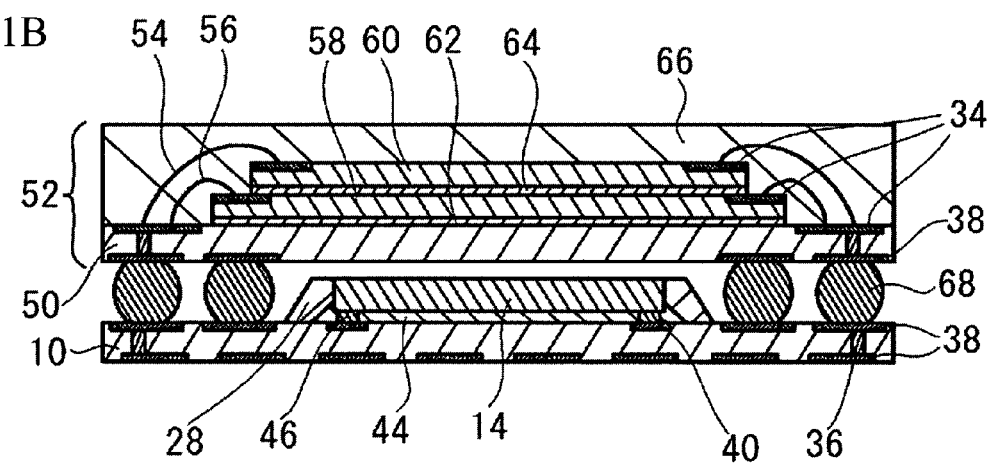

In a seventh embodiment, a description will be given of a method of manufacturing a semiconductor device in accordance with a sixth embodiment shown in FIG. 10. FIG. 11A and FIG. 11B illustrate the manufacturing method in accordance with the seventh embodiment. As shown in FIG. 11A and FIG. 11B, the method in accordance with the seventh embodiment includes manufacturing the semiconductor device with the manufacturing method in accordance with the second embodiment and mounting the built-in semiconductor device. FIG. 11A illustrates the manufacturing of the semiconductor device in accordance with the second embodiment. As shown in FIG. 11A, the semiconductor device is manufactured with the processes shown in FIG. 5A through FIG. 5C.

However, in FIG. 11A, the number of semiconductor elements 14 is one, the wire-connecting pad 34 is not provided on the substrate 10, while the land electrode 38 is provided, as distinguished from FIG. 5A through FIG. 5C. FIG. 11B illustrates the process of mounting the built-in semiconductor device. As shown in FIG. 11B, the built-in semiconductor device 52 is mounted on the semiconductor element 14 of the semiconductor device manufactured with the method shown in FIG. 11A so that a space is formed between the semiconductor element 14 and the built-in semiconductor device 52. Here, the built-in semiconductor device 52 is electrically coupled to the substrate 10 with the solder ball 68. The solder ball 68 may be made of lead-tin solder (PbSn), lead-free solder (SnAgCu or the like), or tin-zinc solder (SnZn) or the like. The solder ball 68 may also be made of a metal such as gold or copper.

With the manufacturing method in accordance with the seventh embodiment, it is possible to manufacture the semiconductor device in accordance with the sixth embodiment shown in FIG. 10. It is possible to minimize the damage to the side surface of the semiconductor element 14 caused by an external impact at any time before mounting the built-in semiconductor device 52 or when mounting the built-in semiconductor device 52, because the entire side surface of the semiconductor element 14 is enclosed by the molding portion 28. It is also possible to improve the yield ratio of the semiconductor device. It is further possible to reduce a distance between the substrate 10 and the substrate 50, because the upper surface of the semiconductor element 14 is not enclosed by the molding portion 28. It is therefore possible to reduce the height of the semiconductor device because the size of the solder ball 68 may be decreased. As such, it is possible to decrease the size of the semiconductor device because the interval between each of the solder balls 68 in a lateral direction can be reduced.

Figure 12:
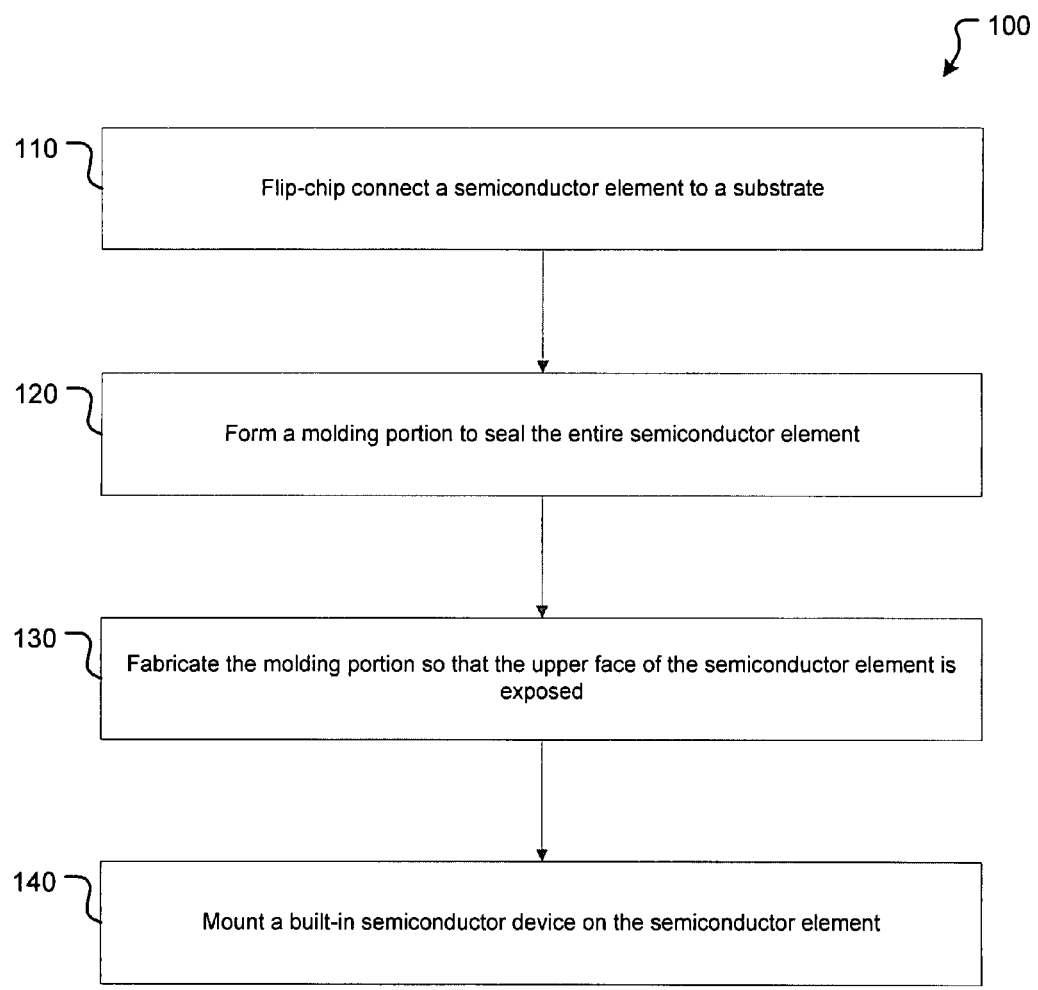
FIG. 12 illustrates a flowchart for the process of manufacturing a semiconductor device in accordance with various embodiments of the invention.

FIG. 12 illustrates a flowchart 100 for the process of manufacturing a semiconductor device in accordance with various embodiments of the invention. At block 110 a semiconductor element 14 is flip-chip connected to a substrate 10. At block 120 a molding portion 28 is formed to seal the entire semiconductor element 14. At block 130 the molding portion 28 is fabricated so that the upper surface of the semiconductor element 14 is exposed. Then a built-in semiconductor device 48 is mounted on the semiconductor element 14 at block 140.

Figure 13:
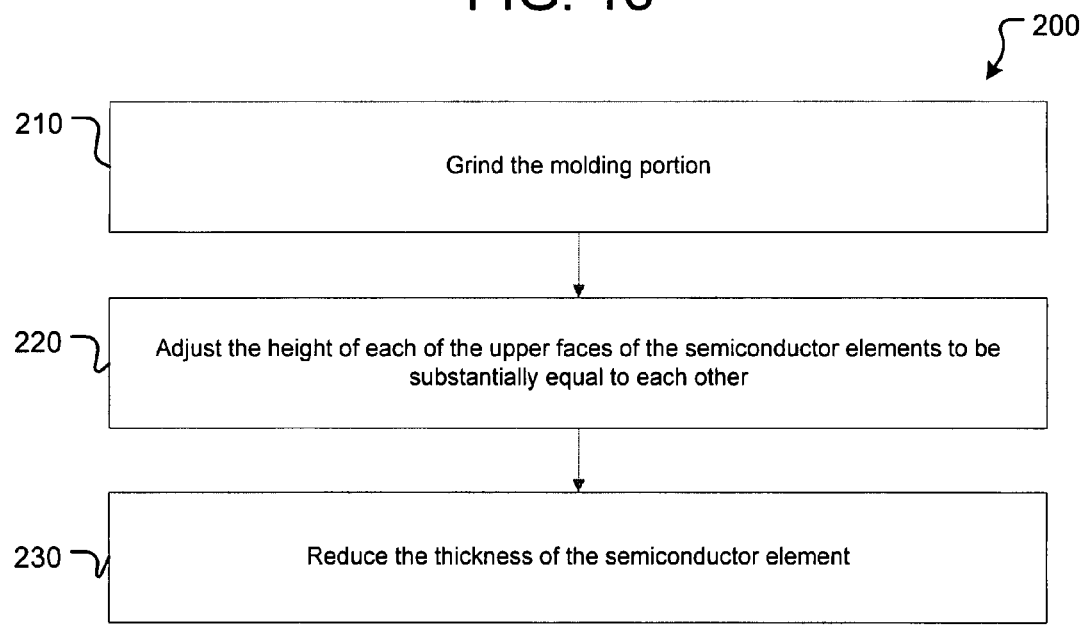
FIG. 13 illustrates a flowchart for the process of fabricating a molding portion in a semiconductor device in accordance with various embodiments of the invention.

FIG. 13 illustrates a flowchart 200 for the process of fabricating a molding portion in a semiconductor device in accordance with various embodiments of the invention. At block 210 the molding portion 28 is ground to a desirable thickness. At block 220 the height of each of the upper faces of the semiconductor elements 14 is adjusted to be substantially equal to each other. The overall thickness of the semiconductor element 14 is thus reduced at block 230.

Figure 14A:
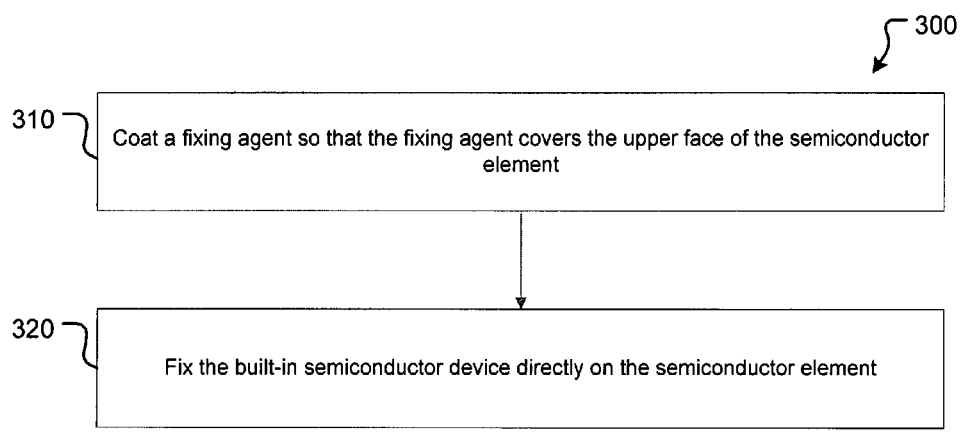
FIGS. 14a and 14b illustrate flowcharts for alternative processes of mounting a built-in semiconductor device on the semiconductor element in accordance with embodiments of the invention.
Figure 14B:
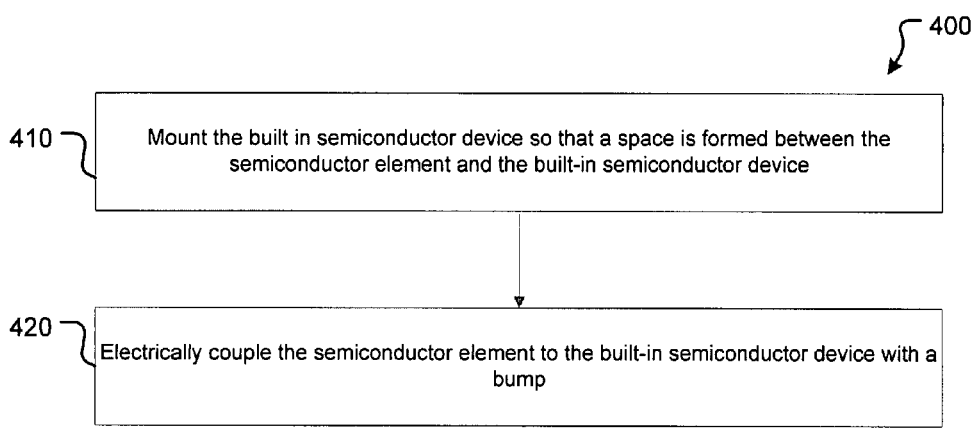

FIGS. 14*a* and 14*b* illustrate alternative processes of mounting a built-in semiconductor device on the semiconductor element in accordance with embodiments of the invention. FIG. 14*a* illustrates a flowchart 300 for the process of mounting the built-in semiconductor device 48 directly on the semiconductor element 14. At block 310 the upper surface of the semiconductor element 14 is coated with a fixing agent 20 so that the fixing agent 20 covers the upper surface of the semiconductor element 14. At block 320 the built-in semiconductor device 48 is affixed directly on the semiconductor element 14. FIG. 14*b* illustrates a flowchart 400 for the process of mounting the built-in semiconductor device 48 indirectly on the semiconductor element 14. At block 410 the built-in semiconductor device 48 is mounted so that a space is formed between the semiconductor element 14 and the built-in semiconductor device 48. Then at block 420 the semiconductor element 14 is electrically coupled to the built-in semiconductor device 48 with a bump 46.

Embodiments generally relate to a semiconductor device and a method of manufacturing the semiconductor device, and in particular, relate to a semiconductor device in which a plurality of built-in semiconductor devices are stacked and a method of manufacturing the semiconductor device. In one implementation, the various embodiments are applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones, etc.).

Flash memory stores information in an array of floating gate transistors, called "cells," each of which traditionally stores one bit of information. However, newer flash memory devices can store more than 1 bit per cell. These newer flash memory devices double the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, the newer flash memory devices have several key advantages, such as being capable of burst-mode access as fast as 80 MHz, page access times as fast as 25 ns, simultaneous read-write operation for combined code and data storage, and low standby power (e.g., 1 µA).

Figure 15:
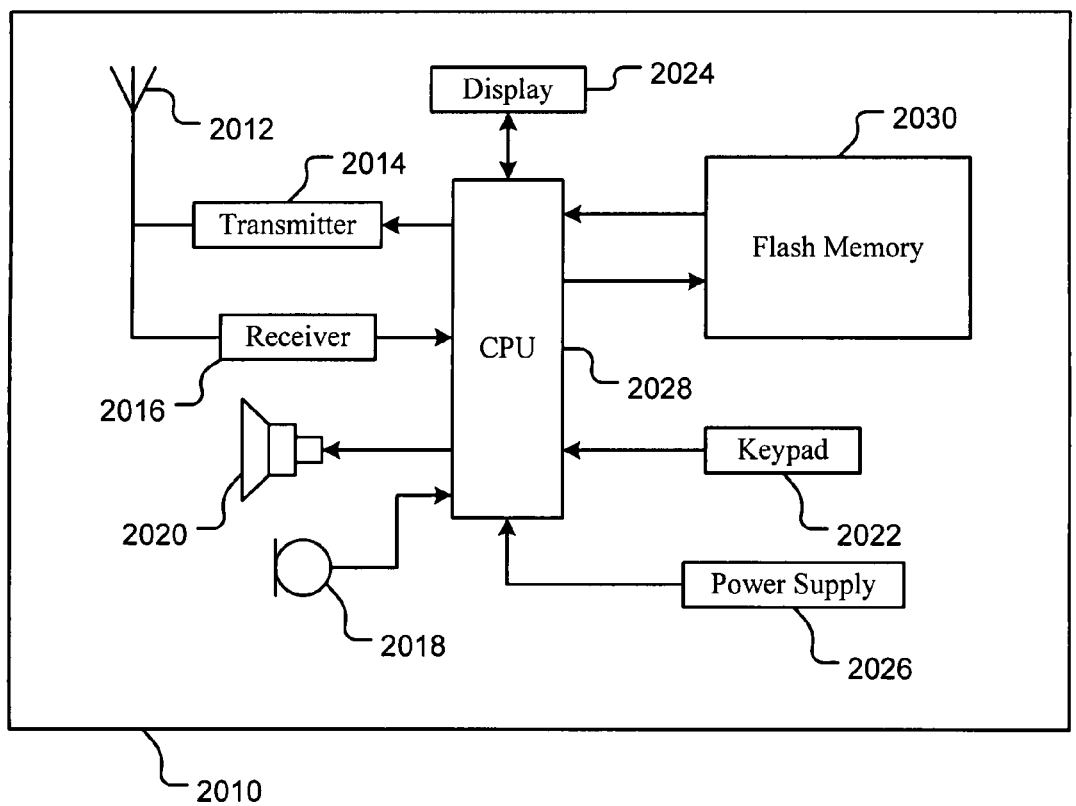
FIG. 15 illustrates a block diagram of an exemplary portable phone, upon which various embodiments of the invention may be implemented.

FIG. 15 shows a block diagram of an exemplary portable telephone 2010 (e.g., cell phone, cellular phone, mobile phone, internet protocol phone, wireless phone, etc.), upon which various embodiments of the invention can be implemented. The cell phone 2010 includes an antenna 2012 coupled to a transmitter 2014 and a receiver 2016, as well as a microphone 2018, a speaker 2020, a keypad 2022, and a display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. In the present embodiment, Flash memory 2030 may include a semiconductor device comprising: a substrate; a semiconductor element that is flip-chip connected to the substrate; and a molding portion that seals the semiconductor element, with the side surfaces of the semiconductor element being enclosed by the molding portion, and with an upper surface of the semiconductor element not being enclosed by the molding portion. In various embodiments, the flash memory 2030 can be utilized with various devices, such as mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are coupled to the bit lines in a parallel configuration, while in a conventional NAND-type flash memory, the memory cell transistors are coupled to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps), flash memory requirements have steadily increased. Thus, an improved flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

It is noted that the components (e.g., 2012, 2014, 2016, 2022, 2028, 2030, etc.) of portable telephone 2010 can be coupled to each other in a wide variety of ways. For example, in an embodiment, the antenna 2012 can be coupled to transmitter 2014 and receiver 2016. Additionally, the transmitter 2014, receiver 2016, speaker 2020, microphone 2018, power supply 2026, keypad 2022, flash memory 2030 and display 2024 can each be coupled to the processor (CPU) 2028. It is pointed out that in various embodiments, the components of portable telephone 2010 can be coupled to each other via, but are not limited to, one or more communication buses, one or more data buses, one or more wireless communication technologies, one or more wired communication technologies, or any combination thereof.

Figure 16:
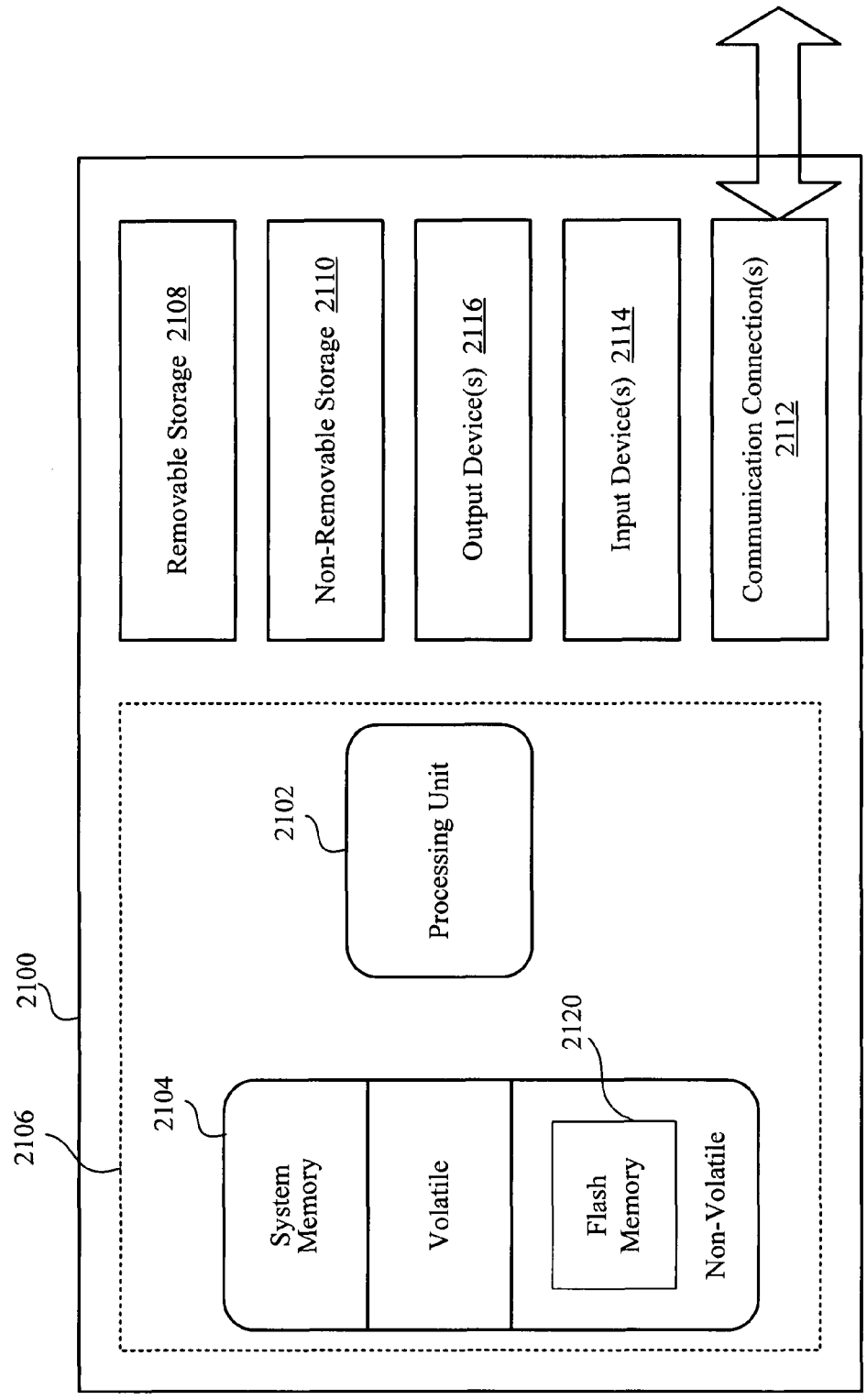
FIG. 16 illustrates a block diagram of an exemplary computing device, upon which various embodiments of the invention may be implemented.

FIG. 16 illustrates a block diagram of an exemplary computing device 2100, upon which various embodiments of the invention can be implemented. Although computing device 2100 is shown and described in FIG. 16 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. In an embodiment, computing device 2100 can include additional components not shown in FIG. 16.

Also, it is appreciated that the computing device 2100 can be a variety of things. For example, computing device 2100 may be, but is not limited to, a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounter frequent physical impacts. Also, flash memory is more able than other types of memory to withstand intense physical pressure and/or heat. Thus, portable computing devices are able to be used in a greater range of environmental variables.

Computing device 2100 can include at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 16 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could be a game cartridge receiving component utilized to receive different game cartridges. In another example, in the context of a Digital Versatile Disc (DVD) recorder, the removable storage is a DVD receiving component utilized to receive and read DVDs. Such additional storage is illustrated in FIG. 16 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, Flash memory 2120 may include a semiconductor device comprising: a substrate; a semiconductor element that is flip-chip connected to the substrate; and a molding portion that seals the semiconductor element, with the side surfaces of the semiconductor element being enclosed by the molding portion, and with an upper surface of the semiconductor element not being enclosed by the molding portion.

In various embodiments, the flash memory 2120 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. Further, in one embodiment, the flash memory 2120 utilizes newer flash memory technology to allow storing of two physically distinct bits on opposite sides of a memory cell.

Device 2100 may also contain communications connection(s) or coupling(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection or coupling, and wireless media such as acoustic, radio frequency (RF), infrared and other wireless media. The term computer readable media as used herein includes both storage media and communication media.

It is noted that the components (e.g., 2102, 2104, 2110, 2120, etc.) of computing device 2100 can be coupled to each other in a wide variety of ways. For example in various embodiments, the components of computing device 2100 can be coupled to each other via, but are not limited to, one or more communication buses, one or more data buses, one or more wireless communication technologies, one or more wired communication technologies, or any combination thereof.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well known in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous.

Figure 17:
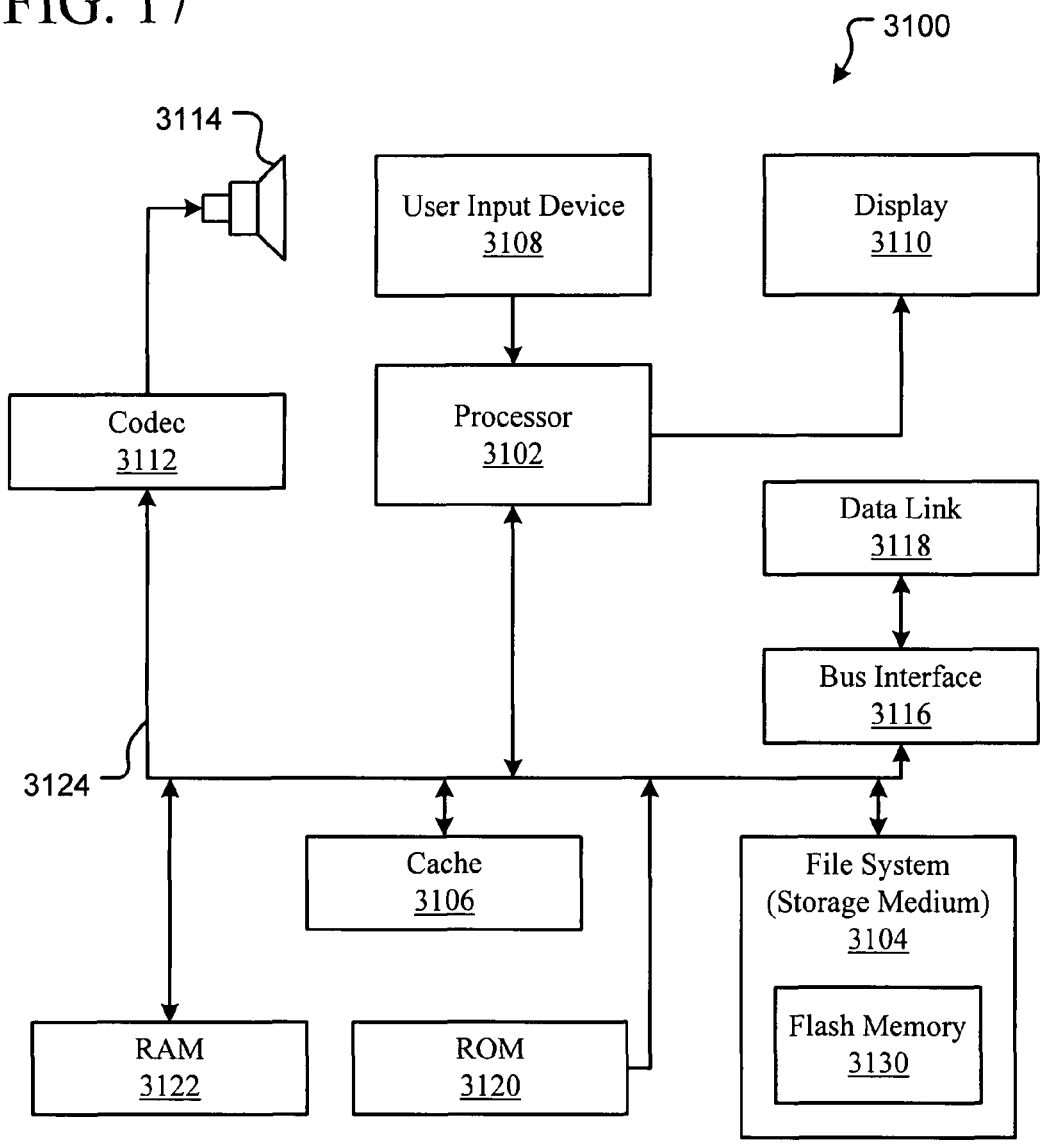
FIG. 17 illustrates an exemplary portable multimedia device, or media player, in accordance with various embodiments of the invention.

FIG. 17 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage medium or a plurality of storage media, such as disks, memory cells, and the like. The file system 3104 typically provides high capacity storage capability for the media player 3100. Also, file system 3104 includes flash memory 3130. In the present embodiment, Flash memory 3130 may include a semiconductor device comprising: a substrate; a semiconductor element that is flip-chip connected to the substrate; and a molding portion that seals the semiconductor element, with the side surfaces of the semiconductor element being enclosed by the molding portion, and with an upper surface of the semiconductor element not being enclosed by the molding portion.

In various embodiments, the flash memory 3130 can be utilized with various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones. However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3122 and a Read-Only Memory (ROM) 3120. The ROM 3120 can store programs, utilities or processes to be executed in a non-volatile manner. The RAM 3122 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3112. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs, photos, video, etc.) in the file system 3104. When a user desires to have the media player play/display a particular media item, a list of available media assets is displayed on the display 3110. Then, using the user input device 3108, a user can select one of the available media assets. The processor 3102, upon receiving a selection of a particular media item, supplies the media data (e.g., audio file, graphic file, video file, etc.) for the particular media item to a coder/decoder (CODEC) 3110. The CODEC 3110 then produces analog output signals for a speaker 3114 or a display 3110. The speaker 3114 can be a speaker internal to the media player 3100 or external to the media player 3100. For example, headphones or earphones that couple to the media player 3100 would be considered an external speaker.

In a particular embodiment, the available media assets are arranged in a hierarchical manner based upon a selected number and type of groupings appropriate to the available media assets. For example, in the case where the media player 3100 is an MP3-type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

It is noted that the components (e.g., 3102, 3104, 3120, 3130, etc.) of media player 3100 can be coupled to each other in a wide variety of ways. For example, in an embodiment, the codec 3122, RAM 3122, ROM 3120, cache 3106, processor 3102, storage medium 3104, and bus interface 3116 can be coupled to data bus 3124. Furthermore, the data link 3118 can be coupled to the bus interface 3116. The user input device 3108 and the display 3110 can be coupled to the processor 3102 while the speaker 3114 can be coupled to the codec 3112. It is pointed out that in various embodiments, the components of media player 3100 can be coupled to each other via, but are not limited to, one or more communication buses, one or more data buses, one or more wireless communication technologies, one or more wired communication technologies, or any combination thereof.

The foregoing descriptions of various specific embodiments in accordance with the invention have been presented for purposes of illustration and description. They are not intended to be exhaustive or to limit the invention to the precise forms disclosed, and obviously many modifications and variations are possible in light of the above teaching. The invention can be construed according to the Claims and their equivalents.

What is claimed is:

1. A semiconductor device comprising:
a substrate;
a semiconductor element that is flip-chip connected to the substrate over a plurality of solder balls mounted on the substrate such that a space is formed between the substrate and the semiconductor element, the semiconductor element comprising a plurality of side surfaces and an upper surface;
a molding portion comprising separate inclined portions formed to entirely enclose the plurality of side surfaces of the semiconductor element;
a fixing portion comprising an adhesive agent and disposed over an upper surface of the semiconductor element; and
a built-in semiconductor device horizontally mounted over the semiconductor element, a bottom surface of the built-in semiconductor device being fixed to the semiconductor element through the fixing portion,
wherein no portion of the upper surface is enclosed by the molding portion, further wherein a thermal conductivity of the molding portion is lower than a thermal conductivity of the semiconductor element.

2. The semiconductor device as claimed in claim 1 comprising a plurality of the semiconductor elements.

3. The semiconductor device as claimed in claim 2, wherein the heights of each of the semiconductor elements is substantially equal to each other.

4. The semiconductor device as claimed in claim 1, wherein the entire upper surface of the semiconductor element is covered with the fixing portion.

5. The semiconductor device as recited in claim 4 wherein the fixing portion comprises a metal.

6. The semiconductor device as claimed in claim 1, wherein heat from the substrate is conducted to the built-in semiconductor device via the semiconductor element and the molding portion.

7. The semiconductor device as recited in claim 1, wherein the plurality of solder balls are comprised of lead-tin solder (PbSn).

8. The semiconductor device as recited in claim 1, wherein the plurality of solder balls are comprised of lead-free solder (SnAgCU).

9. The semiconductor device as recited in claim 1, wherein the plurality of solder balls are comprised of tin-zinc solder (SnZn).

10. The semiconductor device as recited in claim 1, wherein the plurality of solder balls are comprised of a metal from the group of metals comprising gold (Au) and copper (Cu).

11. The semiconductor device as recited in claim 1, wherein a second substrate layer is disposed over the built-in-semiconductor device.

12. The semiconductor device as recited in claim 11, wherein the second substrate layer is coupled to the substrate via a wire.

13. The semiconductor device as recited in claim 12, wherein heat is conducted to the built-in-semiconductor device via the semiconductor element and a fixing portion disposed between the built-in-semiconductor device when the second substrate layer is coupled to the substrate via a wire.

14. The semiconductor device as recited in claim 13, wherein the lower thermal conductivity of the molding portion relative to the thermal conductivity of the semiconductor device is operable to allow a high level of heat to be conducted from the substrate to the built-in semiconductor device.

* * * * *